(12) United States Patent
Feenstra

(10) Patent No.: US 9,519,019 B2
(45) Date of Patent: Dec. 13, 2016

(54) METHOD FOR DETECTING OR PREDICTING AN ELECTRICAL FAULT

(71) Applicant: GE Aviation Systems LLC, Grand Rapids, MI (US)

(72) Inventor: Roger Dale Feenstra, Grand Rapids, MI (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 351 days.

(21) Appl. No.: 13/860,853

(22) Filed: Apr. 11, 2013

(65) Prior Publication Data

US 2014/0306717 A1   Oct. 16, 2014

(51) Int. Cl.
| | |
|---|---|
| G01R 31/08 | (2006.01) |
| G01R 31/02 | (2006.01) |
| G01R 31/04 | (2006.01) |
| G01R 19/165 | (2006.01) |
| G01R 31/00 | (2006.01) |

(52) U.S. Cl.
CPC .............. *G01R 31/08* (2013.01); *G01R 31/04* (2013.01); *G01R 31/041* (2013.01); *G01R 19/1659* (2013.01); *G01R 31/008* (2013.01)

(58) Field of Classification Search
CPC ..... G01R 31/00; G01R 31/008; G01R 31/021; G01R 31/022; G01R 31/024; G01R 31/025; G01R 31/026; G01R 31/04; G01R 31/041; G01R 31/06; G01R 31/08; G01R 31/081; G01R 31/083; G01R 31/085; G01R 19/1659

USPC ........ 324/543, 540, 537, 528, 527, 512, 500
See application file for complete search history.

(56) References Cited

U.S. PATENT DOCUMENTS

| | | | | |
|---|---|---|---|---|
| 4,591,940 A | * | 5/1986 | Sun ...................... | H02H 1/0084 361/66 |
| 5,325,358 A | * | 6/1994 | Goeldner .............. | H04L 49/153 370/219 |
| 5,623,199 A | * | 4/1997 | Taniguchi et al. .............. | 324/66 |
| 6,037,780 A | | 3/2000 | Ohtaki | |
| 6,434,288 B1 | * | 8/2002 | Uemura .............. | H04J 14/0283 370/216 |
| 6,870,377 B2 | * | 3/2005 | Thomsen ..................... | 324/727 |
| 7,631,230 B2 | * | 12/2009 | Williams ............. | G01R 31/088 324/538 |
| 8,129,981 B2 | * | 3/2012 | Bolz ....................... | H04B 3/30 324/117 H |
| 8,613,410 B2 | * | 12/2013 | Bohlmann .............. | B61L 1/187 246/122 R |
| 2002/0089335 A1 | | 7/2002 | Williams | |

OTHER PUBLICATIONS

European Search Report and Written Opinion issued in connection with corresponding EP Application No. 14164000.3-1560 dated Aug. 22, 2014.

\* cited by examiner

*Primary Examiner* — Hoai-An D Nguyen
(74) *Attorney, Agent, or Firm* — GE Global Patent Operation; William S. Munnerlyn

(57) ABSTRACT

A method of predicting an electrical fault in an electrical network, wherein a signal indicative of a transmission is received, compared to a reference signal, a determination is made and if the comparison suggests a fault, indicating the determination of the fault.

9 Claims, 2 Drawing Sheets

METHOD FOR DETECTING OR PREDICTING AN ELECTRICAL FAULT

BACKGROUND OF THE INVENTION

Cables for transmissible signals, such as power or data, provide for transmission of the transmissible signals from a source to a destination. Such cables have a variety of applications, and are well-suited for long or short distance transmission between resources or devices.

A signal travelling along an electrical transmission line will be partly, or wholly, reflected back in the opposite direction when the travelling signal encounters a discontinuity in the transmission parameters of the line. Reflections can occur, for instance, when a transmission line has failed, or is about to fail. The line reflections cause several undesirable effects, as the originating signal combines with the reflected signal. The resulting signal can cause intermittent failures, signal degradation, and even damage to connected devices on the affected node. Sensitive electronics may register the undesirable effects as failures of components when the reflections are the true cause.

When transmission line reflections occur, a device, application, or electrical node may be taken offline or out of service for diagnostics and repair.

BRIEF DESCRIPTION OF THE INVENTION

The invention relates to a method of detecting and predicting an electrical fault in a node of an electrical network, the method includes receiving a monitor signal indicative of a transmission signal on the node, comparing the monitor signal to a reference transmission signal, determining a fault when the comparison satisfies a fault threshold, and indicating the determination of the fault.

DESCRIPTION OF EMBODIMENTS OF THE INVENTION

The embodiments of the present invention are related to a method of detecting or predicting an electrical fault in a node of an electrical network transmitting at least one transmissible signal. Any type of transmissible element is envisioned, examples of which include electrical transmissions of data. Moreover, any purpose may be served by the transmissible signal, such as providing power or data for transmittal.

Figure 1:
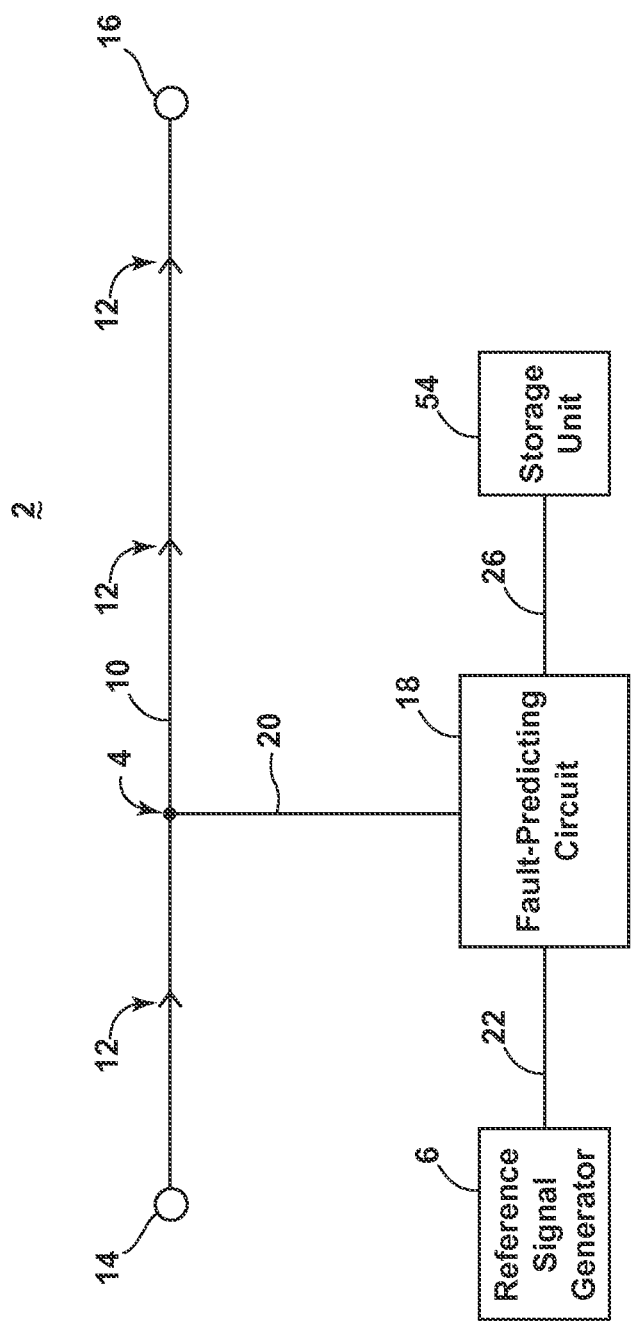
FIG. 1 is a schematic diagram of an electrical network with a fault-detecting and predicting circuit.

FIG. 1 is a schematic illustration of an electrical network 2 for one embodiment of the invention. It should be noted that the electrical network 2 may be any type of electrical network, where power and/or data is transmitted. It is more specifically contemplated that the electrical network 2 is an electrical power distribution network for an aircraft, and/or a data communication network for an aircraft.

The electrical network 2 comprises a source 14 and a destination 16 connected by a transmission cable 10. A fault-predicting circuit 18 is coupled to the transmission cable 10 at node 4 and receives as input a monitor signal 20 indicative of a transmission signal 12 on the cable 10. A transmission signal generator 6 provides a reference transmission signal 22, which is an idealized or faultless version of the transmission signal 12, to the fault predicting circuit 18. An option storage unit 54 receives and stores a fault indicator output 26 from the fault-predicting circuit 18. Additionally, while the network 2 is illustrated with a single cable 10 having a single node 4, the network 2 may have any number of cables and nodes, with only one being illustrated for convenience. Further, the node 4 and the corresponding monitor signal 20 may be located at any desired point on the cable.

In operation, the transmission signal 12 may be transmitted from the source 14 to the destination 16, and, in doing so, passes through a node 4, where the monitor signal 20 is passed to the fault prediction circuit 18, which processes the monitor signal 20 for a fault by comparing the monitor signal 20 to the reference transmission signal 22.

In conducting the comparison, the fault-predicting circuit 18 compares the monitor signal 20 against a fault threshold or a fault threshold range relative to the reference transmission signal 22. Stated another way, the fault-predicting circuit 18 is configured to identify a fault when the monitor signal 20 deviates from the reference transmission signal 22 by a particular amount.

When the fault-predicting circuit 18 predicts a fault, the fault-predicting circuit 18 outputs a fault indicator output 26, which the storage unit 54 may write a fault data event to the memory device that includes the time of the fault. The storage unit 54 may be coupled to a multitude of fault-predicting circuits 18, in which case the storage unit 54 may record additional fault data, such as the location of the transmission cable 10. The storage unit 54 may alternatively record fault data, such as the operation of the transmission signal 12 at the time of the fault, the number of faults registered over a period of time, the number of repeated faults at a particular transmission cable, etc. The fault data may be stored in the storage unit 54 for subsequent retrieval.

Figure 2:
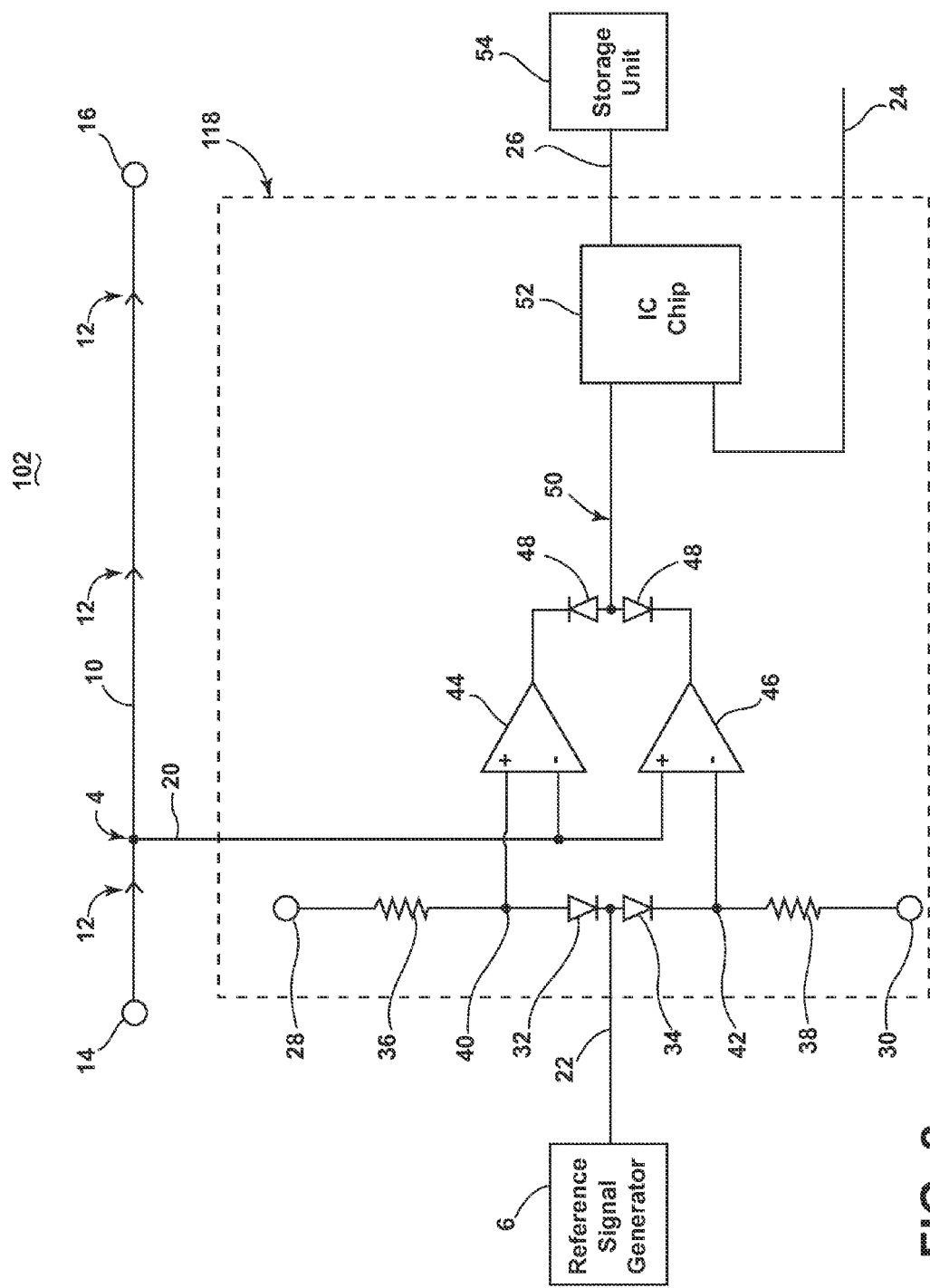
FIG. 2 is a schematic diagram of an electrical network with a fault-detecting and predicting circuit according to a second embodiment of the invention.

FIG. 2 illustrates an alternative electrical network 102 according to a second embodiment of the invention. The second embodiment is similar to the first embodiment; therefore, like parts will be identified with like numerals increased by 100, with it being understood that the description of the like parts of the first embodiment applies to the second embodiment, unless otherwise noted. A difference between the first embodiment and the second embodiment is that the fault-predicting circuit 118 includes one example of a particular circuit for identifying an electrical fault. The fault-predicting circuit 118 is shown comprising a positive direct current (DC) power source 28, a negative DC power source 30, a first diode 32, a second diode 34, a first resistor 36, and a second resistor 38. A portion of the fault-predicting circuit 118 is arranged such that the following components are connected, respectively, in a series configuration: the positive DC power source 28, the first resistor 36, the first diode 32, the second diode 34, the second resistor 38, and the negative DC power source 30. This portion of the fault-predicting circuit 118 receives as input the reference transmission signal 22 between the first diode 32 and the second diode 34.

The fault-predicting circuit 118 further comprises a high fault threshold signal node 40, positioned between the first resistor 36 and the first diode 32, and a low fault threshold signal node 42, positioned between the second resistor 38 and the second diode 34. As illustrated, the fault-predicting circuit 118 further includes a high-side operational amplifier (op-amp) 44 having two inputs and one output, and a low-side op-amp 46 having two inputs and one output. The high-side op-amp 44 receives as input the monitor signal 20 and the high fault threshold signal node 40. The low-side op-amp 46 receives as inputs the monitor signal 20 and the low fault threshold signal node 42.

Each of the high-side and low-side op-amp 44, 46 outputs connect with a normally reverse-biased diode 48 cathode, with the opposing ends or anode of each diode 48 connecting to a common fault node 50. The fault node 50 provides an input for an optional integrated circuit (IC) chip 52 having an additional clear signal input 24, received by a source external to the fault-predicting circuit 118, and the fault indicator output 26. The fault node 50 may additionally comprise componentry suitable such that the fault node 50 can properly translate the signal output of the diodes 48 to an acceptable digital logic input of the IC chip 52.

Additionally, a fault-predicting circuit 118 without the optional IC chip 52 and clear signal input 24 is envisioned, wherein the fault node 50 is directly mapped to the fault indicator output 26 of the circuit 118. The clear signal input 24 may be received from any device which allows for transmitting at least two different signals. In one example, it may be a physical press button that allows a high signal to be transmitted to the IC chip. In another example, it may be the electrical output of a high signal from another device, such as the storage unit 54.

When the monitor signal 20 voltage is below the high fault threshold signal node 40 voltage, the high-side op-amp will output a high signal. If the monitor signal 20 voltage goes higher than the high fault threshold signal node 40 voltage, the high-side op-amp will output a low signal. Likewise, if the monitor signal 20 voltage is above the low fault threshold signal node 42 voltage, the low-side op-amp will output a high signal. If the monitor signal 20 voltage goes lower than the low fault threshold signal node 42 voltage, the low-side op-amp will output a low signal.

This configuration operates such that the fault node 50 has a high signal when both the high-side and low-side op-amps 44, 46 output a high signal. However, when the high-side, low-side, or both op-amps 44, 46 output a low signal, the fault node 50 will have a low signal.

The IC chip 52 is configured to produce a low signal, or no signal, while it receives a high signal at the fault node 50. Conversely, the IC chip 52 is configured to produce a high signal at the fault indicator output 26 when it receives a low signal at the fault node 50. The IC chip 52 is further configured such that once it receives a low signal at the fault node 50, the chip 52 will continue to produce the high signal at the fault indicator output 26 regardless any subsequent input from the fault node 50, until the chip 52 receives a clear signal from the clear signal input 24.

In operation of the electrical network 102 of the second embodiment, the transmission signal 12 may be transmitted from the source 14 to the destination 16, and, in doing so, passes through a node 4, where the monitor signal 20 is passed to the fault prediction and detection circuit 118, which processes the monitor signal 20 for a fault by comparing the monitor signal to the reference transmission signal 22.

The configuration about each of the high and low fault threshold signal node 40, 42 values are preselected to define a threshold signal range for comparison. The first and second resistors 36, 38 are selected, respectively, with reference to the positive DC power source 28, the negative DC power source 30, and the electrical characteristics of the first and second diodes 32, 34, in order to define the voltage values at the high and low fault threshold signal nodes 40, 42. For example, if the positive DC power source 28 is known to be +10V, the negative DC power source 30 is known to be −10V, each first and second diodes 32, 34 operate with a typical 0.7V drop, and the first and second resistor 36, 38 may be selected to be 22 KΩ each, the desired high and low fault threshold signal node 40, 42 values are, respectively, +0.7 V above the reference signal 22 and −0.7 below the reference signal 22. This example is shown as an example whereby an envelope of acceptable limits is derived and in no way are to be construed as a definitive limit or method of setting a limit boundary.

In conducting the comparison, the fault-predicting circuit 118 compares the monitor signal 20 against the high and low fault threshold signal nodes 40,42 using the high-side and low-side op-amps 44, 46. A fault occurs wherein the comparison satisfies a fault threshold, that is, when the comparison indicates the monitor signal 20 lies outside a fault threshold range. In this embodiment of the invention, the monitor signal 20 will lie outside a fault threshold range when the monitor signal 20 is greater than the high fault threshold signal 40 or the monitor signal 20 is below the low fault threshold signal 42. The injection of signal 22 into this circuit functions such that the high side and low fault thresholds may also be dynamic in order to also be useful for fault prediction of time-varying signals.

When the fault-predicting circuit 118 determines a fault has occurred, the circuit 118 indicates the determination of the fault at the fault indicator output 26. The fault-predicting circuit 118 continues to indicate a fault has occurred until the circuit 118 is reset by the clear signal input 24, after which the circuit 118 begins monitoring the node of the electrical network again.

Many other possible embodiments and configurations in addition to that shown in the above figures are contemplated by the present disclosure. For example, one embodiment of the invention contemplates inverting high and low logic signals. Furthermore, one such embodiment of the invention may embed the fault-predicting circuit 18 and storage unit 54 onto a single integrated circuit, as part of a wider-ranging electrical system. Additionally, the design and placement of the various components may be rearranged such that a number of different in-line configurations could be realized, such as including transient noise filters or clamping diodes as needed. Additionally, another embodiment of the circuit could scan various nets having the same or similar characteristics by multiplexing through additional analog switches or relays either or both the reference signal 6 and the monitored signal 20 to support monitoring of a collection of signals.

In another embodiment, after the storage unit 54 records the fault data, the storage unit 54 may reset the fault-predicting circuit 118 by sending a clear signal input 24 to the IC chip 52. In this sense, the storage unit 54 and optional IC chip 52 operate to manage fault control of the fault-predicting circuit 118, when necessary. Moreover, if the fault-predicting circuit 118 detects a fault, the fault indicator output 26 signal may be used to employ safety mechanisms such that the fault is controlled in a safe way by enacting a predetermined course of events such as switching to backup networks or shutting down a system in a safe manner.

The embodiments disclosed herein provide a method of predicting an electrical fault in a node of an electrical network. One advantage that may be realized in the above embodiments is that the fault data may be used by maintenance personnel to indicate a failed or failing transmission cable. The earlier detection of and repair of transmission cable defects translates to higher reliability and quality of the electrical network. Furthermore, the embodiments of the current invention result in superior commercial advantages, in part due to less time spent in the diagnostic phase of repairs and recertification. These advantages, in turn, produce a higher electrical network up-time and lower cost of repair. These advantages are particularly important with regard to class 3 electronics, such as aircraft and nuclear power plant monitoring.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of detecting and predicting an electrical fault in a node, the method comprising:
   transmitting a transmission signal on the node;
   generating a reference transmission signal of the transmission signal;
   receiving a monitor signal indicative of an actual transmission signal for the transmission signal on the node;
   comparing the monitor signal to the reference transmission signal;
   determining a fault when the comparison satisfies a fault threshold; and
   indicating the determination of the fault by at least recording the fault for subsequent retrieval.

2. The method of claim 1 wherein the receiving comprises receiving the monitor signal in real time with the transmission signal.

3. The method of claim 1 wherein the receiving comprises receiving the actual transmission signal as the monitor signal.

4. The method of claim 1 wherein the reference transmission signal is linked to the transmission signal.

5. The method of claim 1 wherein recording the fault comprises storing the fault in a memory device.

6. The method of claim 1 wherein the comparison satisfying a fault threshold comprises the monitor signal lying outside a fault threshold range.

7. The method of claim 1 wherein the comparison satisfying a fault threshold comprises the monitor signal being greater than a high fault threshold.

8. The method of claim 7 wherein the comparison satisfying a fault threshold comprises the monitor signal being less than a low fault threshold.

9. The method of claim 1 further comprising clearing the fault after the indicating.

* * * * *

UNITED STATES PATENT AND TRADEMARK OFFICE
CERTIFICATE OF CORRECTION

| | | |
|---|---|---|
| PATENT NO. | : 9,519,019 B2 | Page 1 of 1 |
| APPLICATION NO. | : 13/860853 | |
| DATED | : December 13, 2016 | |
| INVENTOR(S) | : Feenstra | |

It is certified that error appears in the above-identified patent and that said Letters Patent is hereby corrected as shown below:

In the Specification

In Column 1, Line 46, delete "DESCRIPTION" and insert -- DETAILED DESCRIPTION --, therefor.

In Column 4, Line 47, delete "reference signal 6" and insert -- reference signal 22 --, therefor.

In the Claims

In Column 6, Lines 8-9, in Claim 2, delete "transmission" and insert -- predetermined transmission --, therefor.

In Column 6, Line 14, in Claim 4, delete "transmission" and insert -- predetermined transmission --, therefor.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*